(12) United States Patent
Tamura et al.

(10) Patent No.: US 10,707,078 B2
(45) Date of Patent: Jul. 7, 2020

(54) IMPRINT METHOD, IMPRINT APPARATUS, PROGRAM, AND ARTICLE MANUFACTURING METHOD

(71) Applicant: CANON KABUSHIKI KAISHA, Tokyo (JP)

(72) Inventors: Masahiro Tamura, Utsunomiya (JP); Takuro Yamazaki, Inagi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 369 days.

(21) Appl. No.: 15/442,792

(22) Filed: Feb. 27, 2017

(65) Prior Publication Data

US 2017/0252775 A1 Sep. 7, 2017

(30) Foreign Application Priority Data

Mar. 7, 2016 (JP) ................................. 2016-043492

(51) Int. Cl.
*H01L 21/027* (2006.01)
*G03F 7/00* (2006.01)

(52) U.S. Cl.
CPC ........ *H01L 21/0271* (2013.01); *G03F 7/0002* (2013.01)

(58) Field of Classification Search
USPC ........................................................ 427/256
See application file for complete search history.

(56) References Cited

U.S. PATENT DOCUMENTS

| 8,019,462 B2 | 9/2011 | Yoneda et al. |
| 9,377,777 B2 | 6/2016 | Nakagawa |
| (Continued) | | |

FOREIGN PATENT DOCUMENTS

| JP | 2008502157 A | 1/2008 |
| JP | 4908369 B2 | 4/2012 |
| (Continued) | | |

OTHER PUBLICATIONS

Jing Chen. Soft UV nanoimprint lithography : a versatile technique for the fabrication of plasmonic biosensors. Other [cond-mat.other]. UniversitéParis Sud—Paris XI; Northwestern Polytechnical University (Chine), 2011.*

(Continued)

*Primary Examiner* — James M Mellott
(74) *Attorney, Agent, or Firm* — Rossi, Kimms & McDowell LLP (57) ABSTRACT

There is provided a method for use in molding an imprint material supplied onto a substrate with a mold to form a pattern on the substrate, the method comprising steps of: with respect to each of regions obtained by dividing a region of the mold based on information of a pattern of the mold, obtaining first information of a first arrangement pattern of the imprint material based on information of the pattern of the mold; obtaining second information of a second arrangement pattern of the imprint material based on information of a thickness of a residual layer of the pattern to be formed on the substrate; and obtaining third information of a third arrangement pattern of the imprint material to be arranged on the substrate based on the first information and the second information.

11 Claims, 8 Drawing Sheets

(56) References Cited

U.S. PATENT DOCUMENTS

2005/0270312 A1\* 12/2005 Lad ........................... B41J 3/28
347/1
2007/0278712 A1\* 12/2007 Okushima .............. B82Y 10/00
264/236

FOREIGN PATENT DOCUMENTS

JP        2012069818 A      4/2012
WO    WO-2015030151 A1 \*  3/2015

OTHER PUBLICATIONS

Office Action issued in Japanese Appln. No. 2016-043492 dated Nov. 26, 2019. English translation provided.

\* cited by examiner

IMPRINT METHOD, IMPRINT APPARATUS, PROGRAM, AND ARTICLE MANUFACTURING METHOD

BACKGROUND OF THE INVENTION

Field of the Invention

The present invention relates to an imprint method, an imprint apparatus, a program, and an article manufacturing method.

Description of the Related Art

Miniaturization of devices such as semiconductor devices and magnetic storage media is being progressively demanded and imprint technologies for forming a fine pattern by bringing a mold in contact with an imprint material on a substrate are being focused on. As an exemplary imprint technology, there is a photocuring method in which a photocurable resin is used as an imprint material. In an imprint device using such a photocuring method, first, an imprint material is supplied to an area on a substrate. Next, the imprint material on the substrate is molded with use of a mold. Then, the imprint material molded with use of the mold is cured by emitting light and is then demolded to form a pattern on the substrate.

A method of manufacturing a device described above may include etching a substrate on which a pattern is formed. In this case, when a thickness of a concave portion (a residual layer) of the pattern formed on the substrate is not uniform across the entire surface of the substrate, a shape (for example, a line width) of a pattern obtained by removing the residual layer may be nonuniform. In imprint methods of Published Japanese Translation of PCT application No. 2008-502157 and Patent No. 4908369, an amount of imprint material necessary for obtaining an uniform residual layer thickness is calculated.

However, since the method in the patent literature does not consider a difference of filling (spreading) of an imprint material into a mold according to a shape of a pattern formed on the mold, the method is not favorable in consideration of, for example, uniformity of a residual layer thickness.

SUMMARY OF THE INVENTION

The present invention provides, for example, an imprint method advantageous in uniformity of residual layer thickness.

The present invention provides A method for use in molding an imprint material supplied onto a substrate with a mold to form a pattern on the substrate, the method comprising steps of: with respect to each of regions obtained by dividing a region of the mold based on information of a pattern of the mold, obtaining first information of a first arrangement pattern of the imprint material based on information of the pattern of the mold; obtaining second information of a second arrangement pattern of the imprint material based on information of a thickness of a residual layer of the pattern to be formed on the substrate; and obtaining third information of a third arrangement pattern of the imprint material to be arranged on the substrate based on the first information and the second information.

Further features of the present invention will become apparent from the following description of exemplary embodiments with reference to the attached drawings.

DESCRIPTION OF THE EMBODIMENTS

Hereinafter, an embodiment of the present invention will be described with reference to the drawings and the like.

First Embodiment

Figure 1:
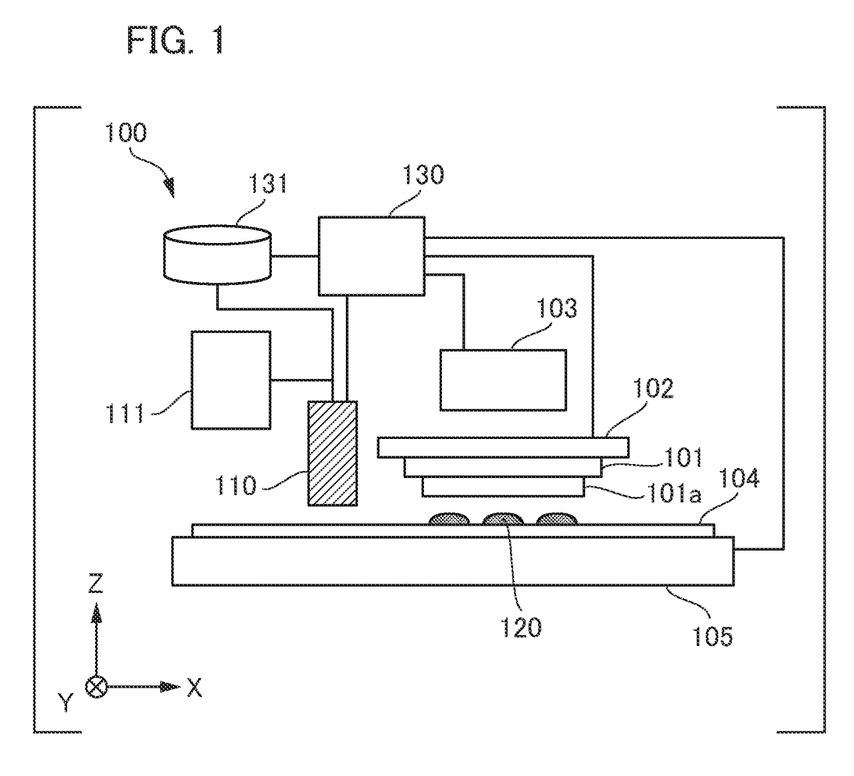
FIG. 1 is a diagram illustrating a configuration of an imprint device using a method according to a first embodiment.

FIG. 1 is a diagram illustrating a configuration of an imprint apparatus using a method according to a first embodiment of the present invention. Here, as an imprint apparatus using a photocuring method, an ultraviolet curing imprint apparatus configured to cure an uncured imprint material on a substrate by emitting ultraviolet rays is used. However, as a method of curing an imprint material, a method of emitting light of another wavelength range and a method using another energy (for example, heat) may be used. In addition, in the following drawings, a Z axis is parallel to an optical axis of ultraviolet rays that are emitted toward an imprint material on a substrate and an X axis and a Y axis are orthogonal to each other in a plane perpendicular to the Z axis. An imprint apparatus 100 includes a mold holder 102 holding a mold 101, an irradiation unit 103 (for example, a halogen lamp) configured to emit ultraviolet rays, a stage 105 holding a substrate 104, a supply device 110 configured to supply an imprint material 120, and a controller 130.

The mold 101 has, for example, a rectangular outer circumferential portion, has a predetermined concavo-convex pattern 101a that is three dimensionally formed on a surface that faces the substrate 104, and is made of a material (for example, quartz) that transmits ultraviolet rays. The mold holder 102 holds and drives the mold 101 in a Z axis direction, brings the mold 101 in contact with the substrate 104, releases (peels) the mold 101 after the imprint material 120 is cured, and transfers (molds) the concavo-convex pattern 101a of the mold 101. The mold 101 is held according to a vacuum suction force, an electrostatic force or the like. The mold holder 102 is driven by a drive mechanism (not shown) that includes a plurality of drive mechanisms such as a coarse movement drive mechanism and a fine movement drive mechanism. The drive mechanism may be a component that has a function of adjusting a position in an X axis, Y axis, Z axis, or θ direction, and a tilt function of correcting an inclination.

The substrate 104 is a substrate to which the concavo-convex pattern 101a is transferred and includes, for example, a single crystal silicon substrate and a Silicon on Insulator (SOT) substrate. The stage 105 holds the substrate 104 by a mechanical holding portion (not shown), for example, a vacuum suction pad, and performs alignment of the substrate 104 and the mold 101. The alignment is performed by a stage drive mechanism (not shown) by which the stage 105 is moveable in an X axis or Y axis direction. The stage drive mechanism may include a plurality of drive mechanisms such as a coarse movement drive mechanism and a fine movement drive mechanism. A function of adjusting a position in an X axis, Y axis, Z axis, or θ direction and a tilt function of correcting an inclination may be included.

The supply device 110 includes a nozzle (not shown) through which the imprint material 120 is discharged and the imprint material 120 is supplied onto the substrate 104. The imprint material 120 is stored in a storage unit 111 and is delivered to the supply device 110 through a pipe. The supply device 110 supplies the imprint material 120 onto the substrate 104 in units of drops (droplets) at intervals of several μm. An amount of one droplet is approximately several picoliters. When the stage 105 is moved (scan movement or step movement) and the imprint material 120 is supplied by the supply device 110, a layer of the imprint material is formed on a pattern formation area (a shot area) of the substrate 104. Note that the supply device 110 itself including a drive unit instead of or together with the stage 105 may be moved.

The controller 130 includes, for example, a computer and a memory, and controls components of the imprint apparatus 100. The method according to the present embodiment may be executed in the computer using a program. The controller 130 supplies the imprint material 120 to a predetermined position with reference to a memory unit 131 in which a supply pattern of droplets (drops) of the imprint material 120 is stored. Next, the controller 130 moves the mold holder 102 or the stage 105, and brings the mold 101 in contact with the imprint material 120 on the substrate 104. In a contact state, the controller 130 causes the irradiation unit 103 to emit ultraviolet rays toward the imprint material 120. When the imprint material 120 is cured, the controller 130 moves the mold holder 102 or the stage 105 and releases the mold 101. According to the above processes, a pattern corresponding to the concavo-convex pattern 101a is formed on the substrate 104.

Figure 2:
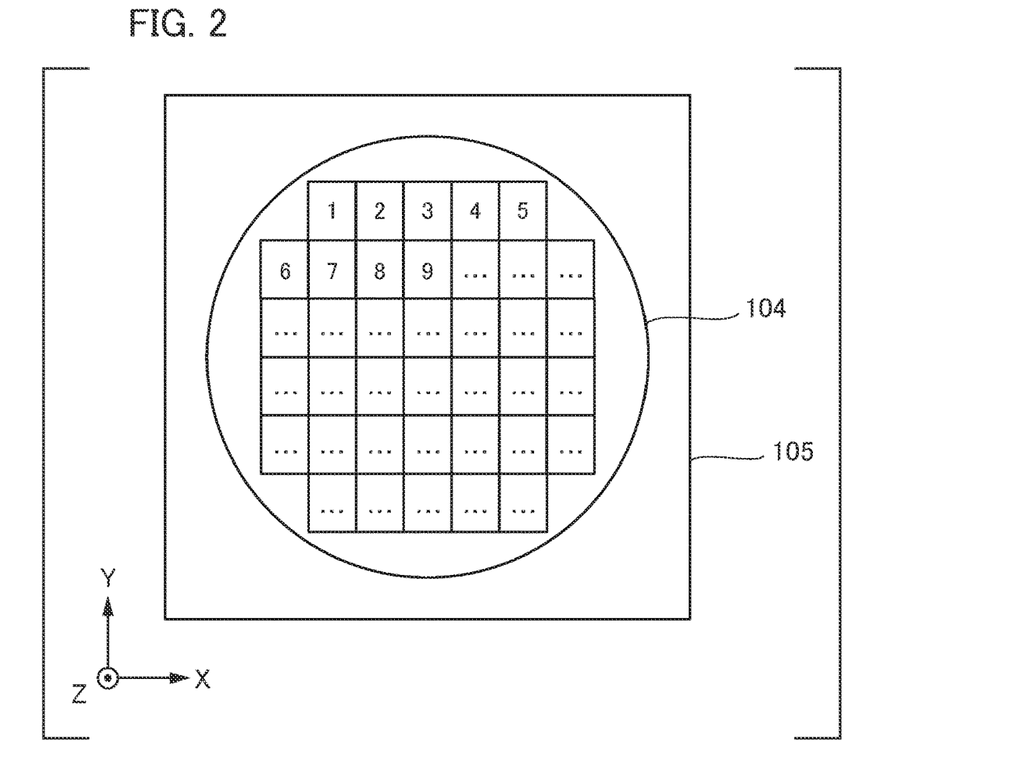
FIG. 2 is a diagram illustrating a substrate mounted on a stage and a shot area of the substrate.

Details of the method according to the present embodiment are as follows. First, the mold 101 capable of forming a desired pattern in the substrate 104 is fixed to the mold holder 102. An identification code (ID) is set to the mold 101, and it is possible to acquire pattern information (for example, an arrangement, a shape, and a density) of the mold 101 with reference to the ID. A relation between an ID and pattern information is stored in, for example, the memory unit 131. On the other hand, as shown in FIG. 2, the substrate 104 is mounted on and fixed to the stage 105. The pattern formation area of the substrate 104 includes a plurality of sections (shots) and imprint processing is performed in the order of numbers shown in the drawing. Also, the order of imprint processing can be set in a staggered order or a random order. In addition, each shot shape (a method of partitioning) is not limited to that shown in FIG. 2.

The controller 130 selects a supply pattern of drops stored in the memory unit 131 based on pattern information of the mold 101 and the like, and sets it in the supply device 110.

The supply pattern is a supply map (a supply recipe) of an imprint material that shows a drop position (arrangement of drops and a supply position) of the imprint material 120 at the substrate 104 and an amount of droplets (an amount of drops and a supply amount). Supply patterns of a plurality of types are prepared in advance based on pattern information of the mold 101. Each of the supply patterns is optimized such that the residual layer is uniform in the shot area. Here, the residual layer refers to a concave portion within a concavo-convex pattern formed on the substrate 104 after the imprint processing is completed.

Figure 3:
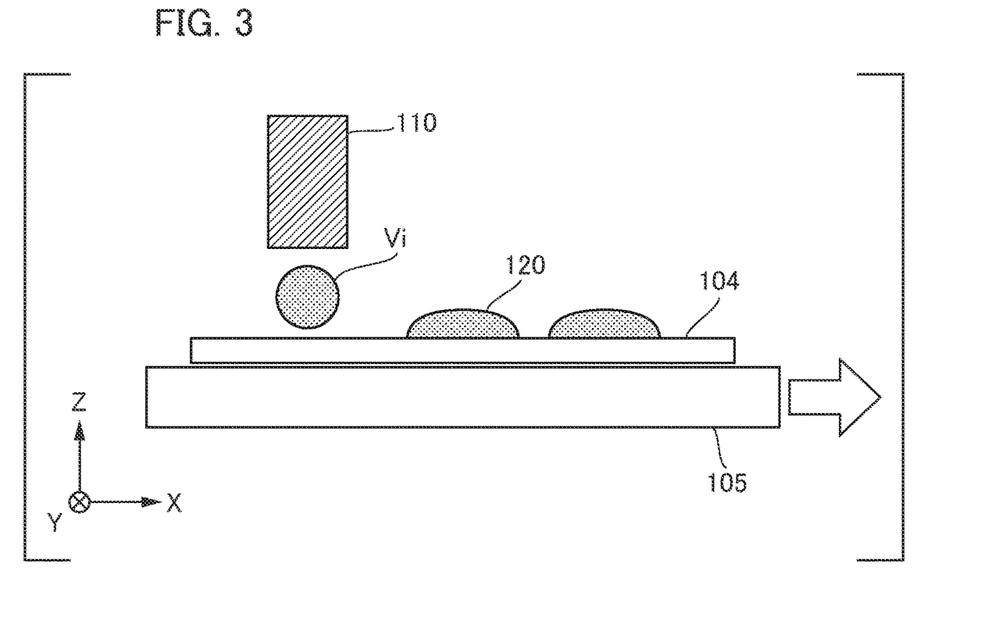
FIG. 3 is a diagram illustrating a state in which a supply device supplies an imprint material onto a substrate.

FIG. 3 is a diagram illustrating a state in which the supply device 110 supplies the imprint material 120 onto the substrate 104. In the present embodiment, the imprint material is supplied by an inkjet method. The supply device 110 supplies the imprint material onto the substrate 104 in units of an amount of drops Vi according to the set supply pattern. In this case, the stage 105 is moved as indicated by an arrow direction shown in the drawing. When the supply device 110 includes a plurality of nozzles, although amounts of drops Vi in the nozzles may not be exactly the same, an average value of amounts of drops may be used as Vi in that case.

Figure 4:
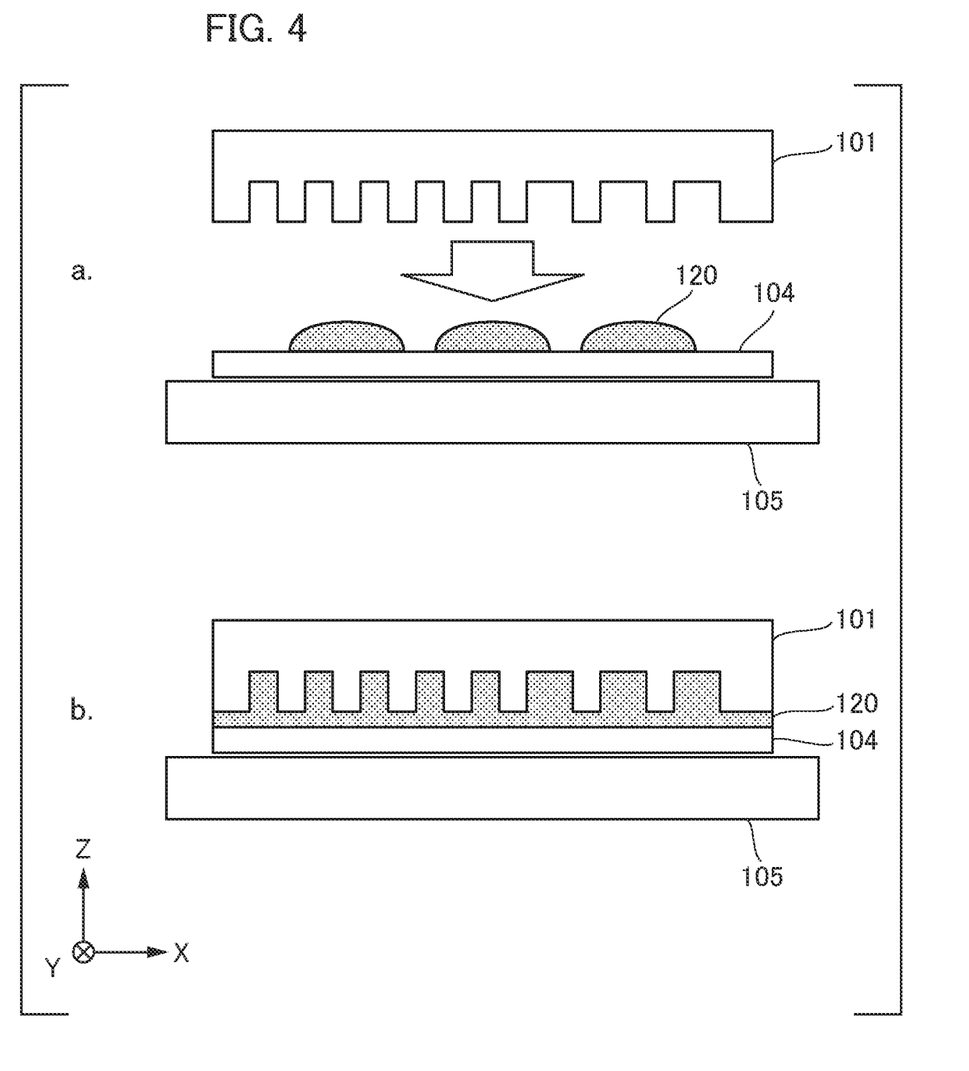
FIG. 4 is a diagram illustrating a state before and after a mold is brought in contact with an imprint material on a substrate.

FIGS. 4A and 4B are diagrams illustrating states in which the mold 101 is brought in contact with the imprint material 120 on the substrate 104, and the imprint material 120 is filled into a concavo-convex pattern of the mold 101. a. of FIG. 4 is a diagram illustrating a state in which supply of the imprint material 120 is completed and the mold 101 is moved in a direction (an arrow direction in the drawing) in which it is brought in contact with the substrate 104. As shown in b. of FIG. 4, while the imprint material 120 is filled into the concavo-convex pattern of the mold 101, the mold 101 remains in contact with the substrate 104 until the imprint material 120 is filled into every part of the concavo-convex pattern. A time required for filling (a filling time) is shorter for a finer pattern and is longer for a larger pattern such as a dummy pattern and a mark.

Figure 5:
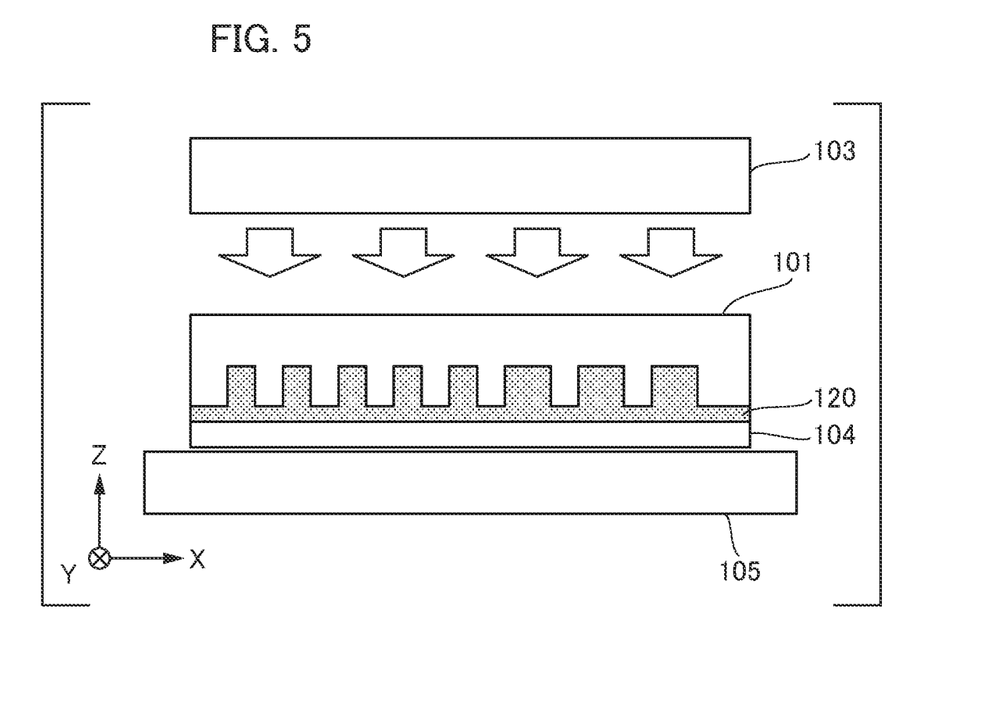
FIG. 5 is a diagram illustrating a state in which an imprint material is cured by ultraviolet light emitted from an irradiation unit.
Figure 6:
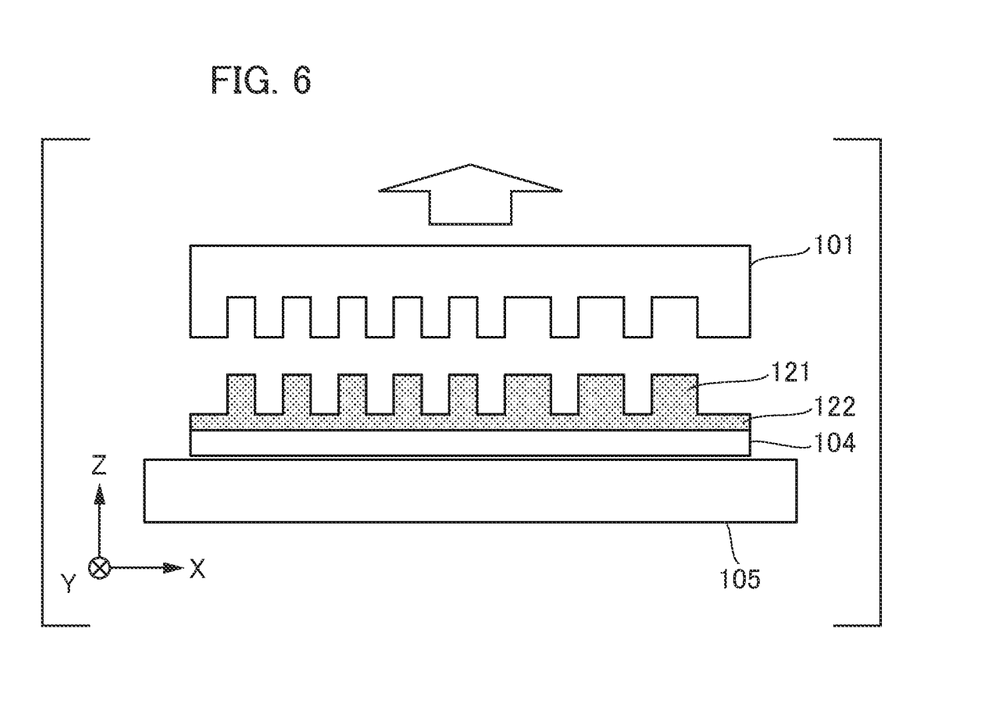
FIG. 6 is a diagram illustrating a state in which a mold is released from an imprint material.

FIG. 5 is a diagram illustrating a state in which the imprint material 120 is cured by ultraviolet light emitted from the irradiation unit 103. As indicated by an arrow in the drawing, ultraviolet light is emitted toward the imprint material 120 from a back side of the mold 101 for a predetermined time. FIG. 6 is a diagram illustrating a state in which the mold 101 is released from the imprint material 120. The mold 101 is released by moving the mold 101 in an arrow direction in the drawing. The imprint material 120 corresponds to the concavo-convex pattern of the mold 101 and is molded as a convex portion (a pattern portion) and a residual layer (a concave portion) 122.

Figure 7A:
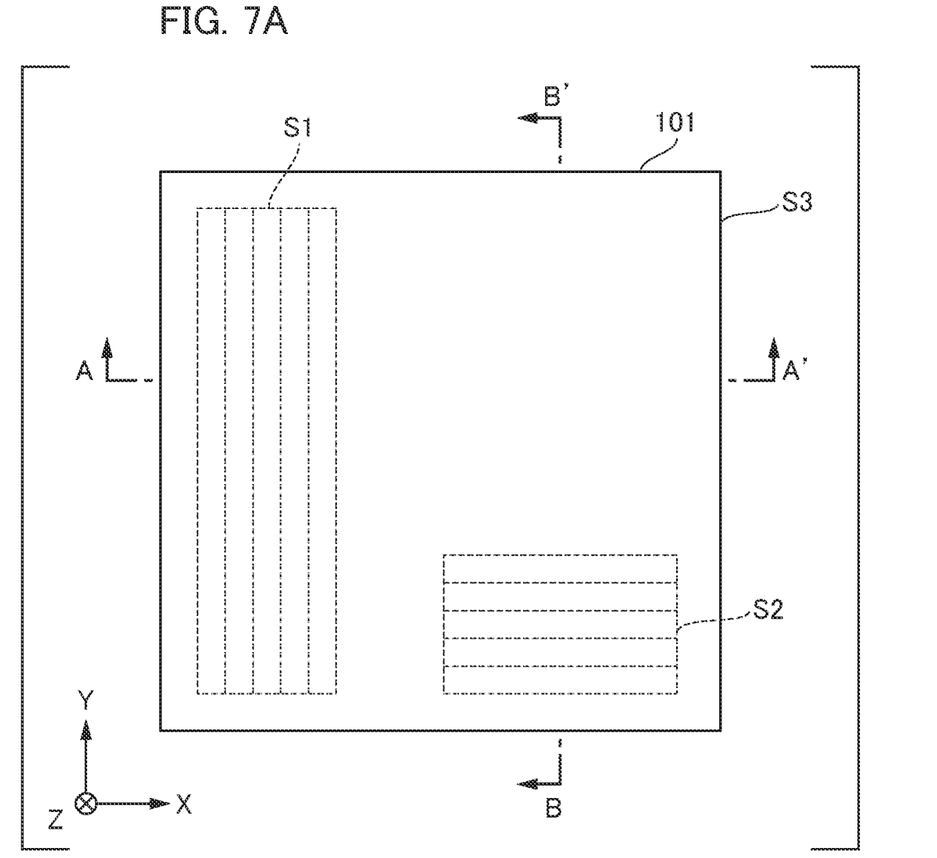
FIG. 7A is a diagram illustrating a surface of a mold which is in contact with an imprint material.
Figure 7B:
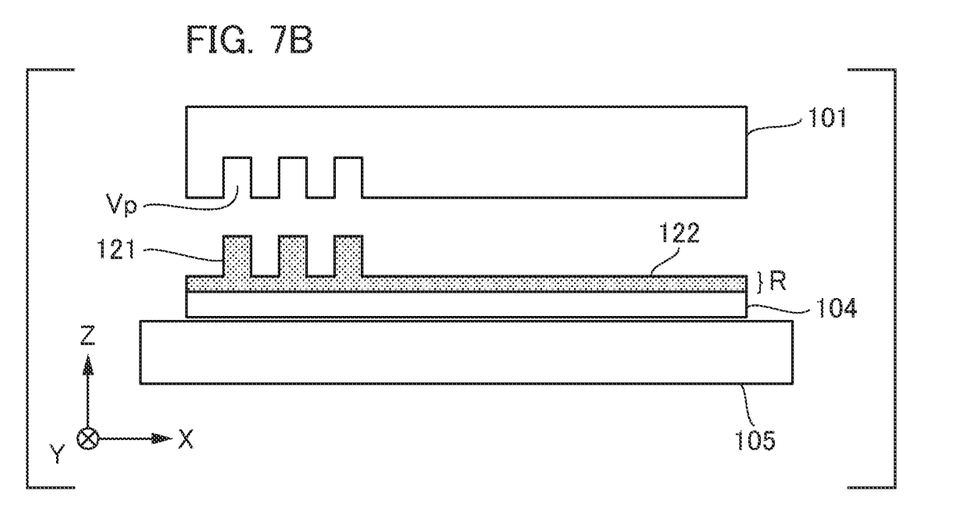
FIG. 7B is a diagram illustrating a pattern of a mold and a cross-sectional view of the mold.

The supply pattern is important in order to obtain a uniform thickness of the residual layer 122. Hereinafter, a method of creating a supply pattern will be described in detail. The supply pattern is created based on pattern information of the mold 101 and a desired thickness of the residual layer 122. FIGS. 7A and 7B are diagrams illustrating a pattern of the mold 101 and a cross-sectional view of the mold 101. FIG. 7A shows a surface (a pressing mold surface) of the mold 101 which is in contact with the imprint material 120 and the surface is divided into three areas of an area S1, an area S2 and an area S3. The division of the pressing mold surface is performed based on pattern information of the mold and the result is stored in, for example, the memory unit 131. In the present embodiment, since the mold 101 has two different patterns, the pressing mold surface is divided into the area S1 and the area S2 that are areas in which a pattern is formed and the area S3 that is an area in which no pattern is formed. Note that types of the patterns are classified based on a shape of a pattern, a pattern period, and the like.

FIG. 7B shows an A-A' cross-sectional view and a B-B' cross-sectional view of the mold 101 shown in FIG. 7A. A desired thickness of the residual layer 122 is set as a thickness R and a volume of a concave portion of a pattern of a mold is set as Vp. An amount of drops Vr necessary for forming a residual layer of the thickness R is obtained by Vr=R×S when an arbitrary area within a pressing mold surface is set as S. Here, Vr may be calculated separately for each area or may be calculated over an entire in-plane area. In a mold in which an entire surface has a uniform pattern or a mold in which a difference between patterns of areas is sufficiently small that the patterns can be considered to be uniform over the entire surface, it is possible to reduce a calculation load when calculation is performed over an entire in-plane area. In this case, an amount of drops can be obtained by multiplying a volume of a concave portion per unit area by an area of a mold. In addition, it can be obtained by multiplying an area of the residual layer 122 by a thickness.

The number of drops Nr necessary for forming a residual layer is calculated by Vr/Vi. A calculation load is alleviated since only Nr needs to be calculated in order to change a thickness of a residual layer using the same mold. The number of drops Np necessary for forming a pattern portion is calculated by Vp/Vi since a volume Vp of a concave portion of a pattern of a mold is equal to an amount of drops necessary for forming a pattern portion 121. Also, a volume of the concave portion of the pattern portion of the mold may be changed according to a variation of a production process even if the same master mold is used for production. Therefore, even in molds having the same design, it is desirable that actual dimensions be measured and managed for each mold and reflected in the calculation.

As described above, it is possible to calculate an amount of drops of the supply pattern. Next, arrangement of drops (an arrangement pattern) will be described. Drops are arranged in a lattice shape for each of the areas described above. Spreading of drops is different for each area. Since a pattern formed in a mold has a constant period, when drops are arranged in lattice shapes in which a unit lattice is repeatedly arranged, it is possible to perform uniform filling and reduce a filling time. The lattice shapes are classified into five shapes, an oblique lattice shape, a hexagonal lattice shape, a square lattice shape, a rectangular lattice shape and a parallel lattice shape. Any shape may be selected according to the pattern. Preferably, a lattice type and a lattice interval are determined based on anisotropy of spreading of drops.

Figure 8:
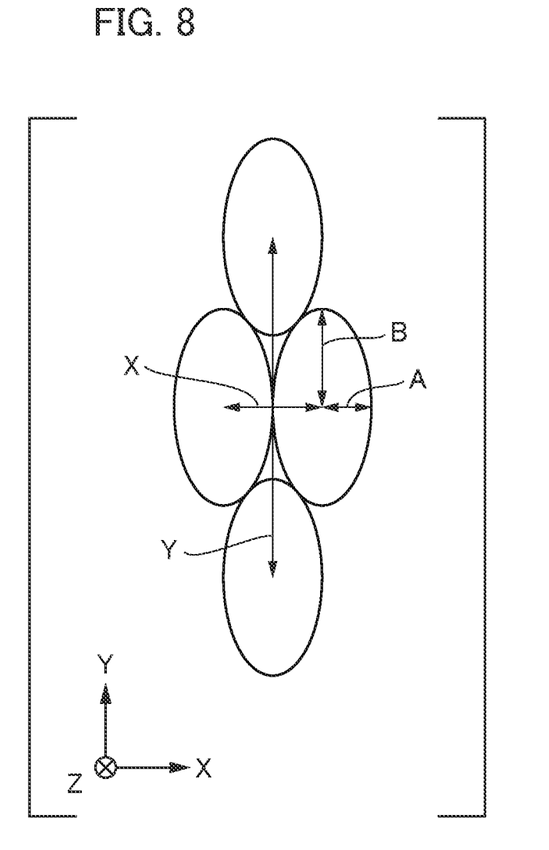
FIG. 8 is a diagram explaining anisotropy of spreading of drops.

For example, FIG. 8 shows anisotropy of spreading of drops in the area S1 in FIG. 7A. In the area S1, patterns of line spaces are uniformly arranged. In this case, as shown in FIG. 8, drops spread in an ellipse shape having a long side in a horizontal direction of the line. FIG. 8 shows a unit lattice when drops are arranged in a hexagonal lattice shape in the area S1. In this manner, when ellipses having a ratio of A:B (a short side A to a long side B) are arranged most densely, if a drop interval in a short side direction is set as X and a drop interval in a long side direction is set as Y, Y/X can be expressed by the following Equation (1).

[Math. 1]

$$\frac{Y}{X} = \sqrt{\frac{3}{4} \times \frac{B}{A}} \qquad (1)$$

Figure 9:
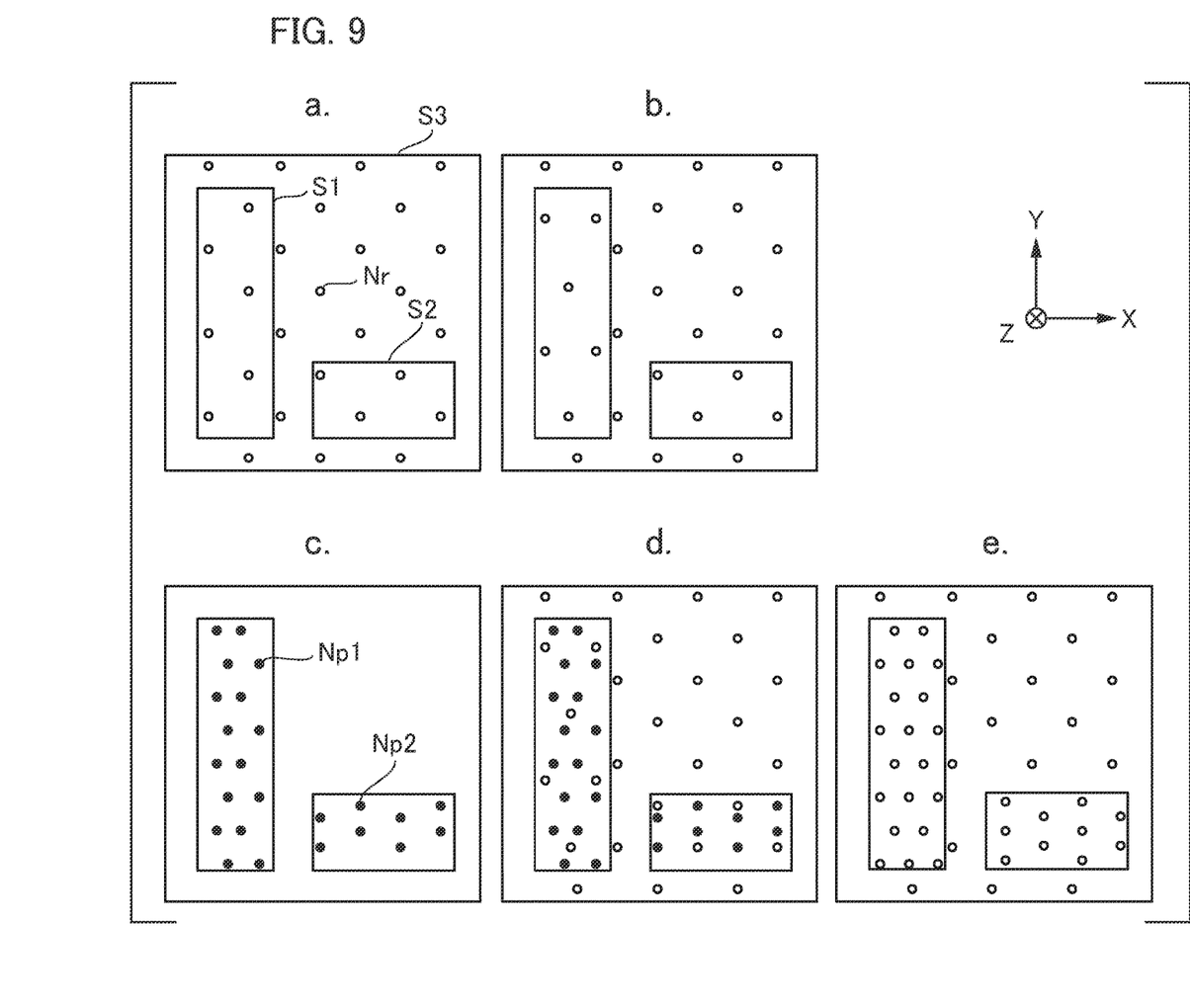
FIG. 9 is a diagram illustrating a method of arranging drops.

That is, in the area S1, it is desirable that droplets be arranged in a hexagonal lattice having a lattice interval that satisfies Equation (1). Anisotropy of spreading of drops can be obtained by a simulation of surface tension according to a pattern and viscosity of a liquid, and can also be obtained by observing actual spreading.

a. to e. of FIG. 9 are diagrams showing a method of arranging drops. a. of FIG. 9 is a diagram showing Nr drops necessary for forming a residual layer that are arranged in the same lattice shape on an entire area of a pressing mold surface of a mold 91. Nr drops are arranged in b. of FIG. 9 (a second arrangement pattern) in consideration of the fact that anisotropy of spreading of drops is different in areas S1, S2 and S3. In general, since the number of drops Nr necessary for forming a residual layer is much smaller than the number of drops Np necessary for forming a pattern, even if the same lattice shape is arranged in the entire area as shown in a. of FIG. 9, a large deviation does not occur in a film thickness. However, strictly, in consideration of anisotropy of spreading of droplets in the areas as in b. of FIG. 9, it is preferable to arrange the droplets in lattice shapes.

c. of FIG. 9 is a diagram showing Np1 drops necessary for forming a pattern of an area S1 and Np2 drops necessary for forming a pattern of an area S2 that are arranged in lattice shapes (a first arrangement pattern). The areas S1 and S2 are both preferably arranged in line space patterns and a pattern in which a hexagonal lattice having a wide interval in a line horizontal direction is used as a unit lattice. d. of FIG. 9 shows a diagram obtained by adding arrangements of b. of FIG. 9 and c. of FIG. 9 (a third arrangement pattern). Since the number of drops necessary in each of the areas is not excessive or deficient, no additional process is necessary to prevent a large deviation from occurring in a film thickness. However, preferably, as shown in e. of FIG. 9, drops are rearranged in a lattice shape in consideration of anisotropy of spreading of drops of each area in each of the areas.

Figure 10:
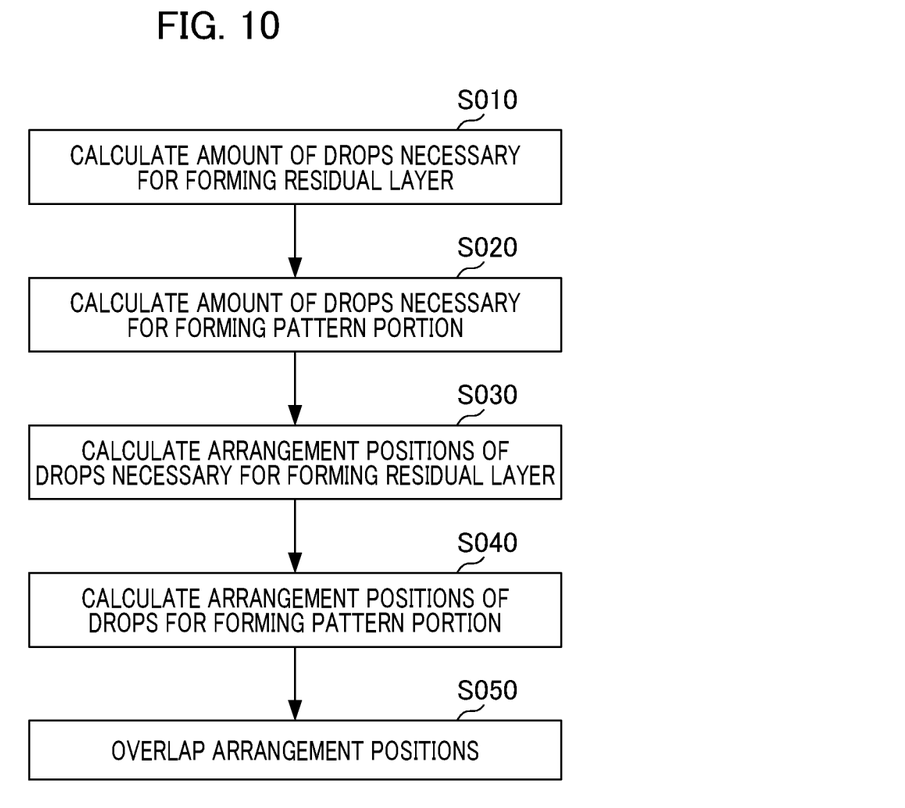
FIG. 10 is a flowchart illustrating creating a supply pattern.

FIG. 10 is a flowchart showing creating a supply pattern according to the present embodiment. The creating may be performed by the controller 130 or may be performed by another device. In Step S010, an amount of drops Vr necessary for forming a residual layer is calculated. In Step S020, an amount of drops Vp necessary for forming a pattern portion is calculated. In Step S030, arrangement positions of drops for forming a residual layer are calculated. In Step S040, arrangement positions of drops for forming a pattern portion are calculated. In Step S050, the calculated arrangement positions are overlapped to obtain an arrangement of drops as shown in d. of FIG. 9. Note that the order of Step S010 to Step S040 may be changed.

A mold in which the areas S1 and S2 have a line space pattern of an interval of 100 nm and the area S3 has a flat pattern in an entire surface, and that has a pattern excavation depth (a depth of a concave portion) of 60 nm and four sides of 10 mm is used to create a supply pattern such that a residual layer has a film thickness of 15 nm. A supply pattern 1 is produced with a unit lattice in consideration of anisotropy in each of the areas as described above. A drop interval X/Y of the area S1 is 0.66. A drop interval X/Y of the area S2 is 1.5. A supply pattern 2 is uniformly produced in a square lattice by calculating an amount of drops necessary for the entire pressing mold surface without dividing the pressing mold surface and without consideration of anisotropy. A supply pattern 3 is arranged in a square lattice in all areas without consideration of anisotropy although the pressing mold surface is divided as described above.

When imprint processing is performed on the supply pattern 1, a film thickness of the residual layer is 15 nm±3 nm in the entire area. An average number of defects in a pattern area is 10 defects/cm$^2$ or less. As a result of the supply pattern 2, a film thickness of the residual layer is 15 nm±10 nm in the entire area and an average number of defects is 300 defects/cm$^2$ or less. As a result of the supply pattern 3, a film thickness of the residual layer is 15 nm±6 nm in the entire area and an average number of defects is 100 defects/cm$^2$ or less. Therefore, the pressing mold surface is divided for each pattern, arrangement is performed in consideration of an amount of drops necessary for each separate area and anisotropy of spreading of drops, and thus it is possible to uniformize a thickness of the residual layer and reduce the number of pattern defects.

In this manner, an imprint method using a supply pattern of the present embodiment can obtain a uniform thickness of the residual layer without a long filling time. Therefore, according to the present embodiment, it is possible to provide an imprint method that is advantageous in terms of uniformity of a thickness of the residual layer.

(A Device Manufacturing Method)

A device manufacturing method (semiconductor integrated circuit element, liquid display element, or the like) as an article may include a step of forming a pattern on a substrate (wafer, glass plate, film-like substrate, or the like) using the imprint apparatus described above. Furthermore, the manufacturing method may include a step of etching the substrate on which a pattern has been formed. When other articles such as a patterned medium (storage medium), an optical element, or the like are manufactured, the manufacturing method may include another step of processing the substrate on which a pattern has been formed instead of the etching step. The device manufacturing method of the present embodiment has an advantage, as compared with a conventional method, in at least one of performance, quality, productivity and production cost of an article.

This application claims the benefit of Japanese Patent Application No. 2016-043492 filed on Mar. 7, 2016, which is hereby incorporated by reference herein in its entirety.

What is claimed is:

1. A method of molding an imprint material supplied onto a substrate with a mold to form a pattern on the substrate, the method comprising steps of:
    generating a supply arrangement pattern for each of a plurality of regions obtained by dividing a region of the mold based on information of a pattern of the mold, the step of generating the supply arrangement pattern comprising steps of, for each region of the plurality of regions:
        obtaining first information corresponding to a first amount of imprint material required to form a first arrangement pattern of the imprint material in a region of the plurality of regions, the first amount of imprint material based on information of the pattern of the mold;
        obtaining second information corresponding to a second amount of imprint material required to form a second arrangement pattern of the imprint material in the region of the plurality of regions, the second amount of imprint material based on a thickness of a residual layer of the pattern to be formed on the substrate, wherein the second arrangement pattern of the imprint material is different from the first arrangement pattern of the imprint material; and
        generating third information corresponding to a total amount of imprint material required to form a supply arrangement pattern of the imprint material to be arranged in the region of the plurality of regions on the substrate, the total amount of imprint material being obtained by combining the first information of the first arrangement pattern of the imprint material and the second information of the second arrangement pattern of the imprint material, wherein the supply arrangement pattern is different from the first and second arrangement patterns;
    supplying the imprint material on the substrate based on the respective supply arrangement patterns of all regions of the plurality of regions; and
    molding the supplied imprint material on the substrate with the mold to form the pattern of the mold on the substrate.

2. The method according to claim 1,
    wherein the information of the pattern of the mold includes information of a volume of a concave portion of the mold per unit area and a shape of the concave portion.

3. The method according to claim 1,
    wherein the step of obtaining the second information obtains the second information further based on an area of the residual layer.

4. The method according to claim 1,
    wherein supply of the imprint material onto the substrate is performed by an inkjet method.

5. The method according to claim 1,
    wherein each of the first arrangement pattern and the second arrangement pattern is an arrangement pattern in a lattice shape.

6. The method according to claim 1,
    wherein the step of obtaining the first information obtains the first information based on anisotropy of filling of the imprint material into the mold due to the pattern of the mold.

7. The method according to claim 1,
    wherein the step of obtaining the second information obtains the second information based on anisotropy of filling of the imprint material into the mold due to the pattern of the mold.

8. The method according to claim 1,
    wherein the regions of the plurality of regions are mutually different in patterns respectively formed therein.

9. The method according to claim 1,
    wherein the second arrangement pattern of the imprint material is an arrangement pattern set so that the thickness of the residual layer is uniform.

10. A method of manufacturing an article, the method comprising steps of:
    forming a pattern on a substrate using an imprint apparatus; and
    processing the substrate, on which the pattern has been formed, to manufacture the article,
    wherein the imprint apparatus molds an imprint material supplied onto the substrate with a mold to form the pattern on the substrate, and includes:

a supply device configured to supply the imprint material onto the substrate; and a controller configured to control the supply device, wherein the controller is configured to:

generate a supply arrangement pattern for each of a plurality of regions, which are obtained by dividing a region of the mold based on information of a pattern of the mold, by, for each region of the plurality of regions:

obtaining first information corresponding to a first amount of imprint material required to form a first arrangement pattern of the imprint material in a region of the plurality of regions, the first amount of imprint material based on information of the pattern of the mold;

obtaining second information corresponding to a second amount of imprint material required to form a second arrangement pattern of the imprint material in the region of the plurality of regions, the second amount of imprint material based on a thickness of a residual layer of the pattern to be formed on the substrate, wherein the second arrangement pattern of the imprint material is different from the first arrangement pattern of the imprint material; and generating third information corresponding to a total amount of imprint material required to form a supply arrangement pattern of the imprint material to be arranged in the region of the plurality of regions on the substrate, the total amount of imprint material being obtained by combining the first information of the first arrangement pattern of the imprint material and the second information of the second arrangement pattern of the imprint material, wherein the supply arrangement pattern is different from the first and second arrangement patterns;

supply the imprint material on the substrate based on the respective supply arrangement patterns of all regions of the plurality of regions; and mold the supplied imprint material on the substrate with the mold to form the pattern of the mold on the substrate.

11. The method according to claim 10, wherein the second arrangement pattern of the imprint material is an arrangement pattern set so that the thickness of the residual layer is uniform.

\* \* \* \* \*